(12) United States Patent
Chen et al.

(10) Patent No.: US 11,018,025 B2
(45) Date of Patent: May 25, 2021

(54) REDISTRIBUTION LINES HAVING STACKING VIAS

(71) Applicant: Taiwan Semiconductor Manufacturing Company, Ltd., Hsin-Chu (TW)

(72) Inventors: Hsien-Wei Chen, Hsin-Chu (TW); Li-Hsien Huang, Puzi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/815,169

(22) Filed: Jul. 31, 2015

(65) Prior Publication Data

US 2017/0032977 A1  Feb. 2, 2017

(51) Int. Cl.

| H01L 21/48 | (2006.01) |
|---|---|
| H01L 23/00 | (2006.01) |
| H01L 25/10 | (2006.01) |
| H01L 25/00 | (2006.01) |
| H01L 23/31 | (2006.01) |
| H01L 21/56 | (2006.01) |

(Continued)

(52) U.S. Cl.
CPC ........ *H01L 21/4857* (2013.01); *H01L 21/486* (2013.01); *H01L 21/56* (2013.01); *H01L 21/568* (2013.01); *H01L 23/3128* (2013.01); *H01L 23/5226* (2013.01); *H01L 24/19* (2013.01); *H01L 24/20* (2013.01); *H01L 25/105* (2013.01); *H01L 25/50* (2013.01); *H01L 23/49811* (2013.01); *H01L 23/49816* (2013.01); *H01L 2224/04105* (2013.01); *H01L 2224/12105* (2013.01); *H01L 2224/19* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2225/1035* (2013.01); *H01L 2225/1041* (2013.01); *H01L 2225/1058* (2013.01); *H01L 2924/14* (2013.01); *H01L 2924/15311* (2013.01)

(58) Field of Classification Search
CPC ........................ H01L 23/5226; H01L 21/4857
USPC .......................................... 257/700; 438/126
See application file for complete search history.

(56) References Cited

U.S. PATENT DOCUMENTS

| 8,361,842 B2 | 1/2013 | Yu et al. |
| 8,680,647 B2 | 3/2014 | Yu et al. |
| 8,703,542 B2 | 4/2014 | Lin et al. |

(Continued)

FOREIGN PATENT DOCUMENTS

| CN | 102640283 A | 8/2012 |
| CN | 104752397 A | 7/2015 |

(Continued)

*Primary Examiner* — Hsin Yi Hsieh
(74) *Attorney, Agent, or Firm* — Slater Matsil, LLP

(57) ABSTRACT

A method includes forming a dielectric layer over a conductive feature, forming an opening in the dielectric layer, and plating a metallic material to form a redistribution line electrically coupled to the conductive feature. The redistribution line includes a via in the opening, and a metal trace. The metal trace includes a first portion directly over the via, and a second portion misaligned with the via. A first top surface of the first portion is substantially coplanar with a second top surface of the second portion of the metal trace.

20 Claims, 23 Drawing Sheets

(51) Int. Cl.
    *H01L 23/522*    (2006.01)
    *H01L 23/498*    (2006.01)

(56) References Cited

U.S. PATENT DOCUMENTS

| | | |
|---|---|---|
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,980,691 B2 | 3/2015 | Lin |
| 9,293,403 B2 | 3/2016 | Park et al. |
| 9,484,319 B2 | 11/2016 | Pendse |
| 9,780,054 B2 | 10/2017 | Guzek et al. |
| 9,793,140 B2 | 10/2017 | Yu et al. |
| 2004/0043533 A1 | 3/2004 | Chua et al. |
| 2005/0077181 A1* | 4/2005 | Zierath .............. C25D 21/12 205/81 |
| 2007/0289127 A1 | 12/2007 | Hurwitz et al. |
| 2011/0215464 A1 | 9/2011 | Guzek et al. |
| 2011/0241195 A1* | 10/2011 | Nalla .................. H01L 24/20 257/690 |
| 2011/0241215 A1 | 10/2011 | Sankman et al. |
| 2011/0291288 A1 | 12/2011 | Wu et al. |
| 2013/0001776 A1* | 1/2013 | Yu ...................... H01L 24/19 257/738 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0161833 A1 | 6/2013 | Pendse |
| 2013/0168848 A1 | 7/2013 | Lin et al. |
| 2013/0200528 A1* | 8/2013 | Lin .................. H01L 23/3157 257/774 |
| 2013/0307140 A1 | 11/2013 | Huang et al. |
| 2014/0070408 A1* | 3/2014 | So ...................... H01L 24/03 257/737 |
| 2014/0159251 A1* | 6/2014 | Marimuthu .......... H01L 24/19 257/774 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0187608 A1* | 7/2015 | Ganesan .............. H01L 24/14 257/738 |
| 2015/0187695 A1* | 7/2015 | Yu .................. H01L 21/76816 257/759 |
| 2016/0218063 A1* | 7/2016 | Tsai .................... H01L 24/20 |

FOREIGN PATENT DOCUMENTS

| | | |
|---|---|---|
| KR | 20130073818 A | 7/2013 |
| KR | 20140029872 A | 3/2014 |

* cited by examiner

REDISTRIBUTION LINES HAVING STACKING VIAS

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. The sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
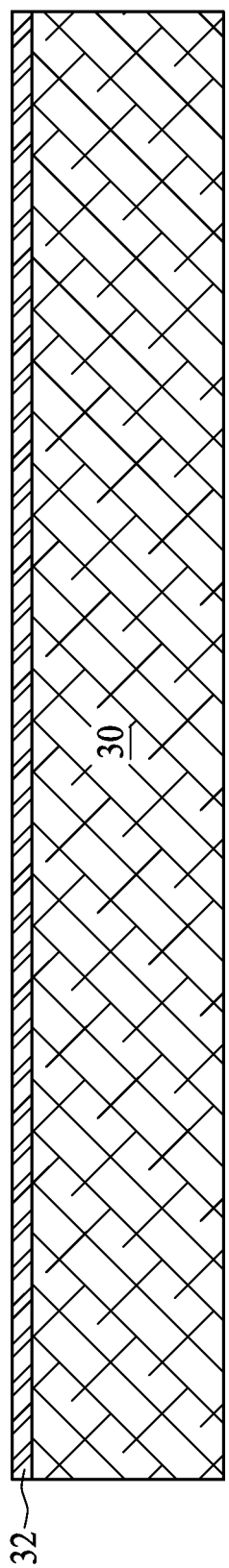
FIGS. 1 through 21 illustrate the cross-sectional views of intermediate stages in the formation of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Package-on-Package (PoP) structure/package and the method of forming the package are provided in accordance with various exemplary embodiments. Some variations of the embodiments are discussed. Throughout the various views and illustrative embodiments, like reference numbers are used to designate like elements. It is appreciated that although the formation of a package is used as an example, the teaching of the present disclosure is readily available for the formation of other integrated circuit components such as wafers/die, interposers, package substrates, or the like.

Figure 23:
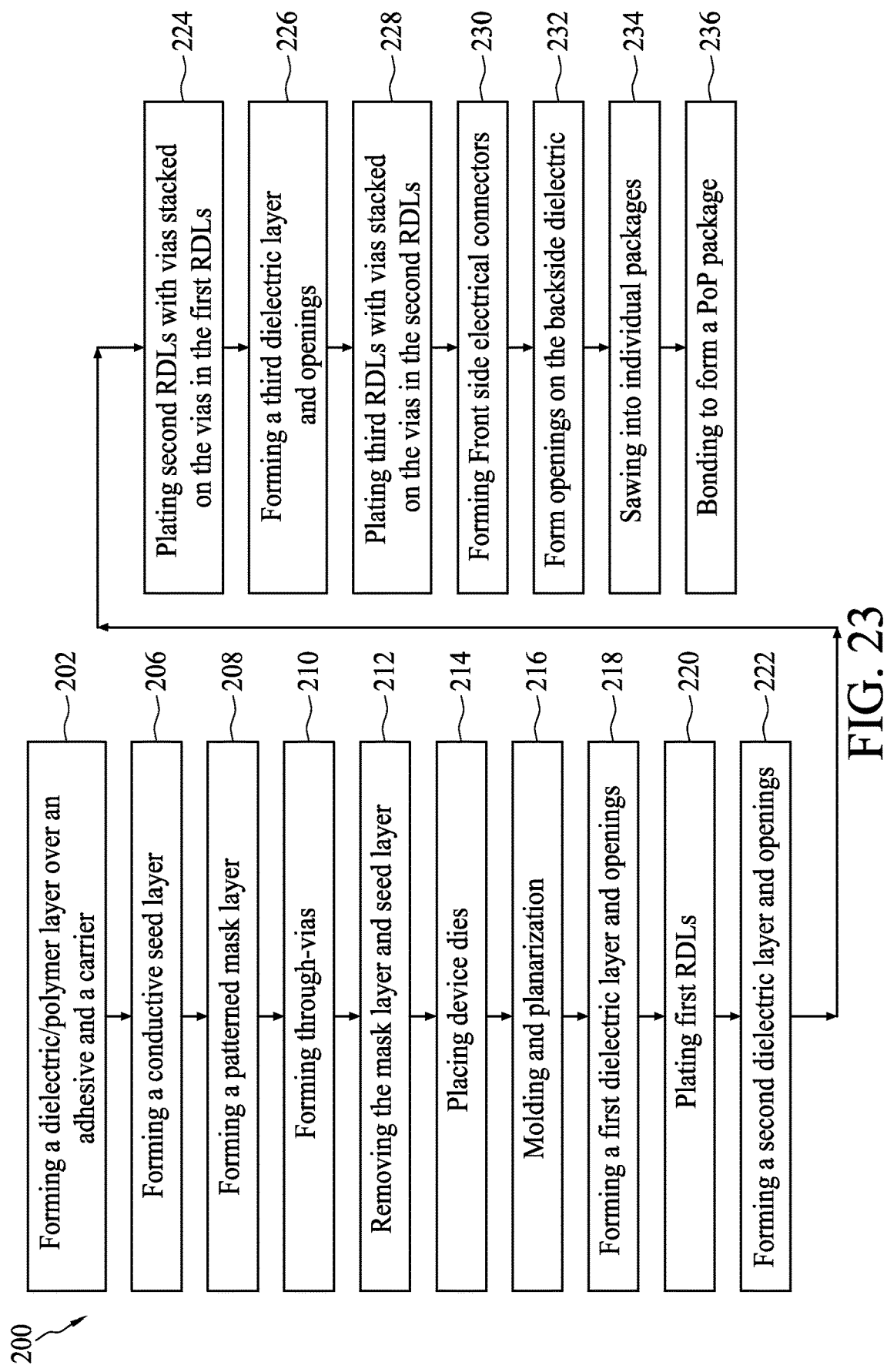
FIG. 23 illustrates a process flow in the formation of a package in accordance with some embodiments.

FIGS. 1 through 21 illustrate the cross-sectional views of intermediate stages in the formation of packages in accordance with some embodiments. In the subsequent discussion, the process steps shown in FIGS. 1 through 21 are discussed referring to the process steps in FIG. 23.

Referring to FIG. 1, carrier 30 is provided, and adhesive layer 32 is disposed over carrier 30. Carrier 30 may be a blank glass carrier, a blank ceramic carrier, or the like, and may have a shape of a semiconductor wafer with a round top-view shape. Carrier 30 is sometimes referred to as a carrier wafer. Adhesive layer 32 may be formed of a Light-to-Heat Conversion (LTHC) material, for example, although other types of adhesives may be used. In accordance with some embodiments of the present disclosure, adhesive layer 32 is capable of decomposing under the heat of light, and hence can release carrier 30 from the structure formed thereon.

Figure 2:
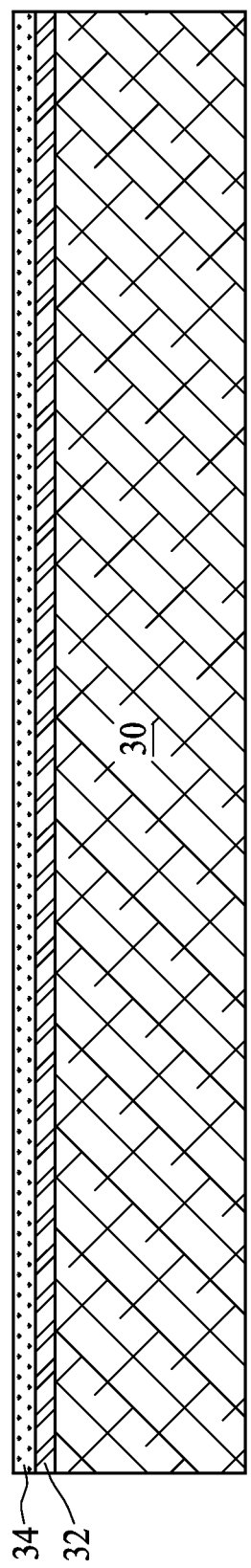

Referring to FIG. 2, dielectric layer 34 is formed over adhesive layer 32. The respective step is shown as step 202 in the process flow shown in FIG. 23. In accordance with some embodiments of the present disclosure, dielectric layer 34 is a polymer layer formed of a polymer, which may be a photo-sensitive polymer such as polybenzoxazole (PBO), polyimide, or the like. In accordance with some embodiments, dielectric layer 34 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 3:
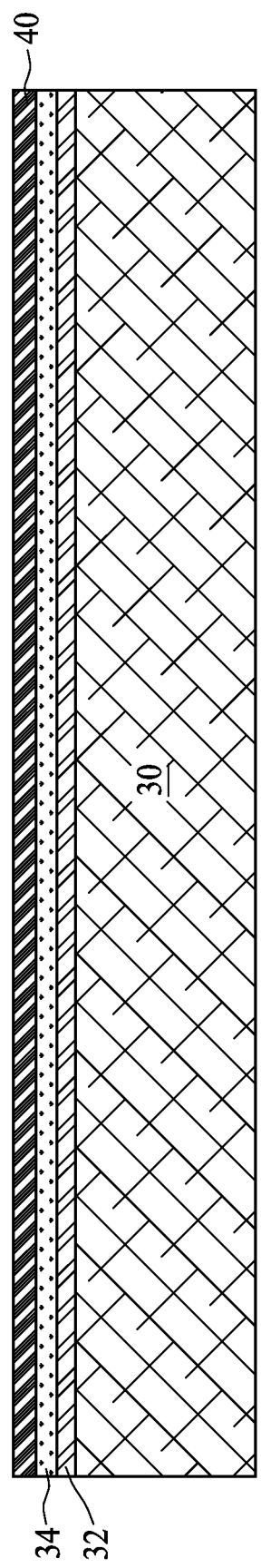

Referring to FIG. 3, conductive seed layer 40 is formed over dielectric layer 34, for example, through Physical Vapor Deposition (PVD). The respective step is shown as step 206 in the process flow shown in FIG. 23. Conductive seed layer 40 may be a metal seed layer including copper, aluminum, titanium, alloys thereof, or multi-layers thereof.

In accordance with some embodiments of the present disclosure, conductive seed layer 40 includes a first metal layer such as a titanium layer (not shown) and a second metal layer such as a copper layer (not shown) over the first metal layer. In accordance with alternative embodiments of the present disclosure, conductive seed layer 40 includes a single metal layer such as a copper layer, which may be formed of substantially pure copper or a copper alloy.

Figure 4:
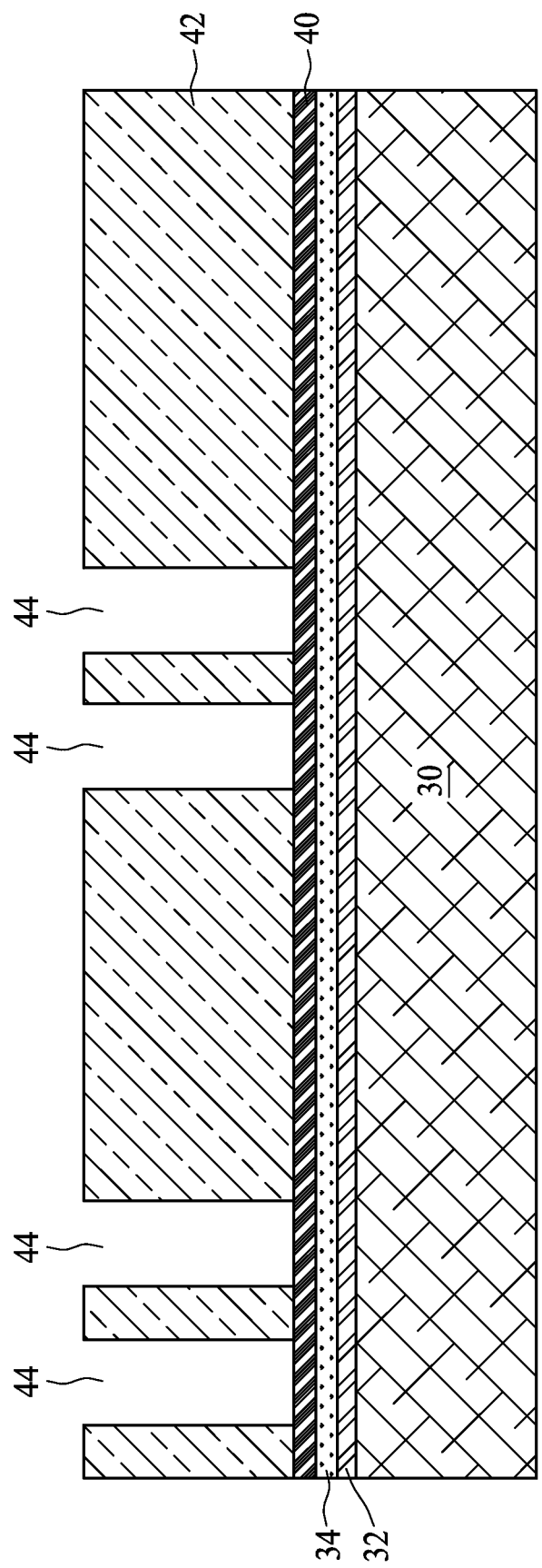

FIGS. 4 through 7 illustrate the formation of through-vias. As shown in FIG. 4, mask layer 42 (such as a photo resist) is applied over conductive seed layer 40, and is then patterned using a photo lithography mask. The respective step is shown as step 208 in the process flow shown in FIG. 23. In accordance with some embodiments of the present disclosure, mask layer 42 is formed of a dry film, which is laminated onto conductive seed layer 40. In accordance with some embodiments, mask layer 42 is formed by spin coating. As a result of the patterning (exposure and development), openings 44 are formed in mask layer 42, through which some portions of conductive seed layer 40 are exposed. The thickness of mask layer 42 is selected to be close to the thickness of the subsequently placed device die 48 (FIG. 8). In accordance with some embodiments of the present disclosure, the thickness of mask layer 42 is greater than the thickness of device die 48.

Figure 5:
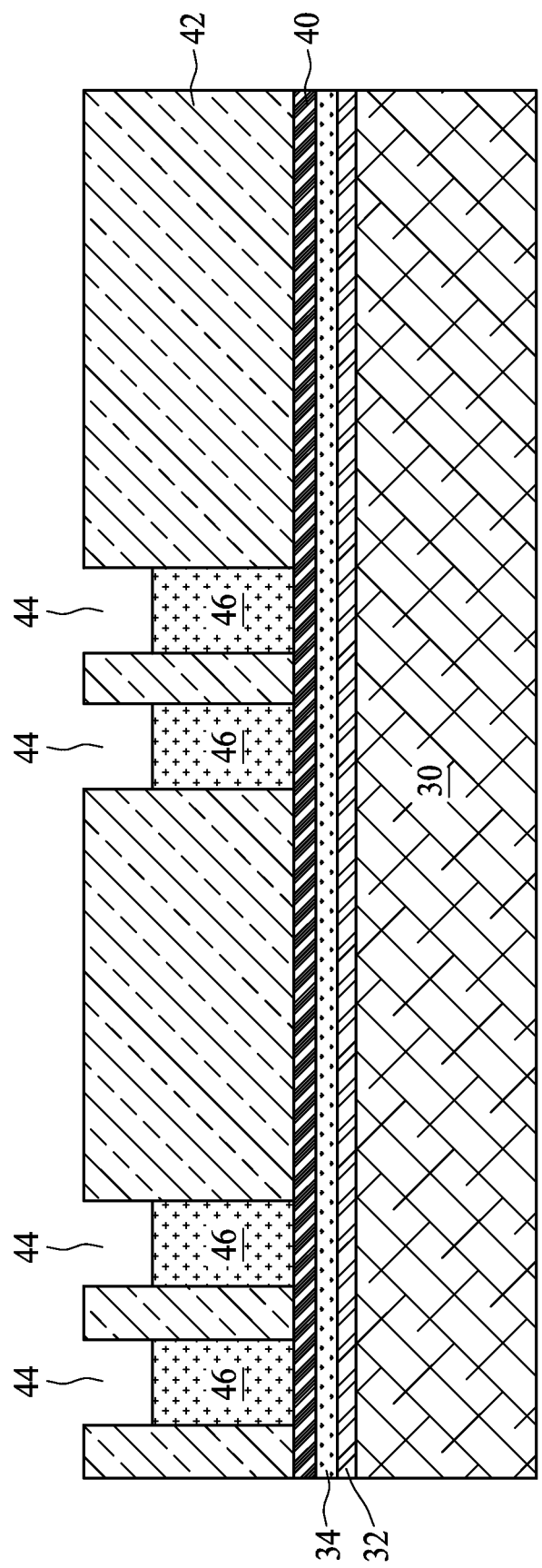

As shown in FIG. 5, through-vias 46 are formed in openings 44 through plating, which may be electro plating or electro-less plating. The respective step is shown as step 210 in the process flow shown in FIG. 23. Through-vias 46 are plated on the exposed portions of conductive seed layer 40. Through-vias 46 are conductive, and may be metal vias including copper, aluminum, tungsten, nickel, or alloys thereof. The top-view shapes of through-vias 46 include, and are not limited to, rectangles, squares, circles, and the like. The heights of through-vias 46 are determined by the thickness of the subsequently placed device dies 48 (FIG. 8), with the heights of through-vias 46 slightly greater than or equal to the thickness of device die 48 in accordance with some embodiments of the present disclosure.

Figure 6:
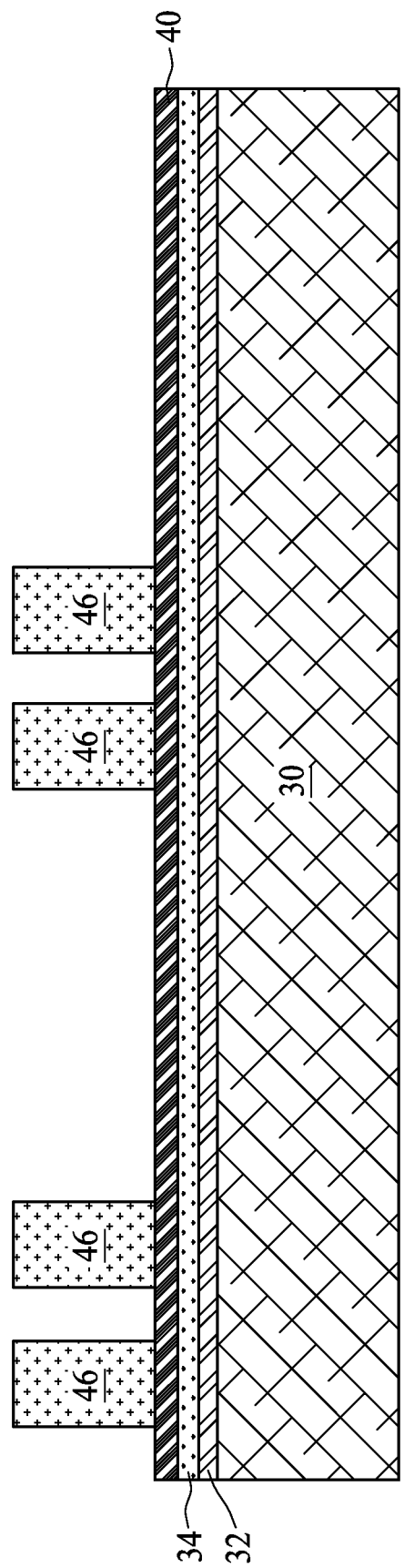

After the plating of through-vias 46, mask layer 42 is removed, and the resulting structure is shown in FIG. 6. The respective step is shown as step 212 in the process flow shown in FIG. 23. As a result, the portions of conductive seed layer 40 that are previously covered by photo resist 42 are exposed.

Figure 7:
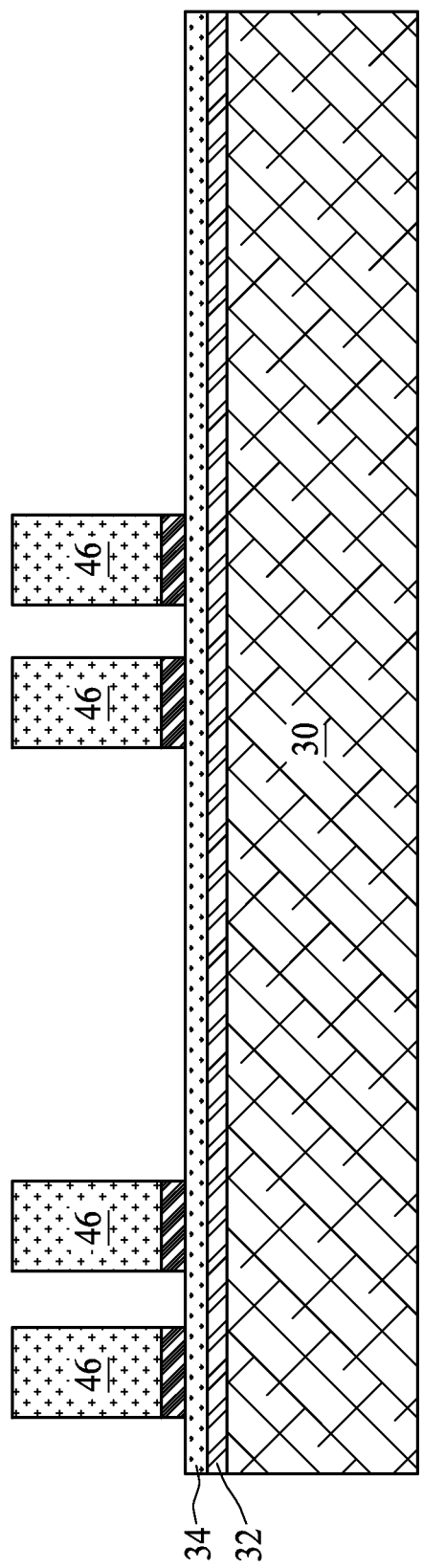
Figure 8:
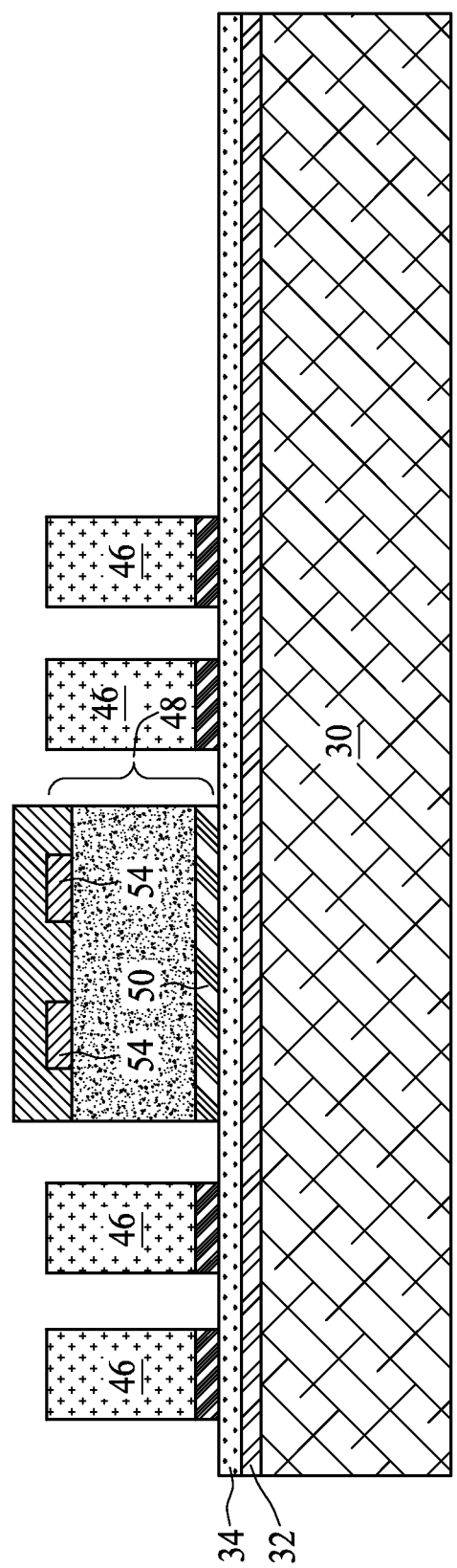

Next, as shown in FIG. 7, an etching step is performed to remove the exposed portions of conductive seed layer 40, wherein the etching may be an anisotropic or isotropic etching. The respective step is also shown as step 212 in the process flow shown in FIG. 23. The portions of conductive seed layer 40 that are overlapped by through-vias 46, on the other hand, remain not etched. Throughout the description, the remaining underlying portions of conductive seed layer 40 are referred to as the bottom portions of through-vias 46. Although conductive seed layer 40 is shown as having distinguishable interfaces with the overlying portions of through-vias 46, when conductive seed layer 40 is formed of a material similar to or the same as that of the respective overlying through-vias 46, some or all of conductive seed layer 40 may be merged with through-vias 46 with no distinguishable interface therebetween. For example, the copper layer in conductive seed layer 40 may be merged with through-vias 46 with no distinguishable interfaces. In accordance with alternative embodiments, there exist distinguishable interfaces between conductive seed layer 40 and the respective overlying plated portions of through-vias 46. For example, the titanium layer in conductive seed layer 40 may be distinguishable from the copper-containing through-vias 46. As a result of the etching of conductive seed layer 40, dielectric layer 34 is exposed.

FIG. 8 illustrates the placement of device die 48 over dielectric layer 34. The respective step is shown as step 214 in the process flow shown in FIG. 23. Device die 48 may be adhered to dielectric layer 34 through die attach film 50, which is an adhesive film. The edges of die attach film 50 are co-terminus with (aligned to) the respective edges of device die 48. It is appreciated that although one device die 48 is illustrated, there is a plurality of device dies 48 placed over dielectric layer 34. The plurality of placed device dies 48 may be arranged as an array including a plurality of rows and a plurality of columns. Device die 48 may include a semiconductor substrate having a back surface (the surface facing down) in physical contact with the respective underlying die attach film 50. Device die 48 further includes integrated circuit devices (such as active devices, which include transistors, for example, not shown) at the front surface (the surface facing up) of the semiconductor substrate. Device die 48 may be a logic die such as a Central Processing Unit (CPU) die, a Graphic Processing Unit (GPU) die, a mobile application die, or the like.

Device die 48 may include metal pillars 54 close to its top surface. Metal pillars 54 are electrically coupled to the integrated circuits (such as transistors) inside device die 48. In accordance with some exemplary embodiments of the present disclosure, as shown in FIG. 8, metal pillars 54 are covered by dielectric layer 51, with the top surfaces of dielectric layer 51 being higher than the top surfaces of metal pillars 54. Dielectric layer 51 further extends into the gaps between metal pillars 54. In accordance with alternative embodiments of the present disclosure, the top surfaces of metal pillars 54 are coplanar with the top surface of the respective dielectric layer 51. Dielectric layers 51 may be formed of a polymer such as PBO in accordance with some exemplary embodiments. Metal pillars 54 may be copper pillars, and may also include other conductive/metallic materials such as aluminum, nickel, or the like.

Figure 9:
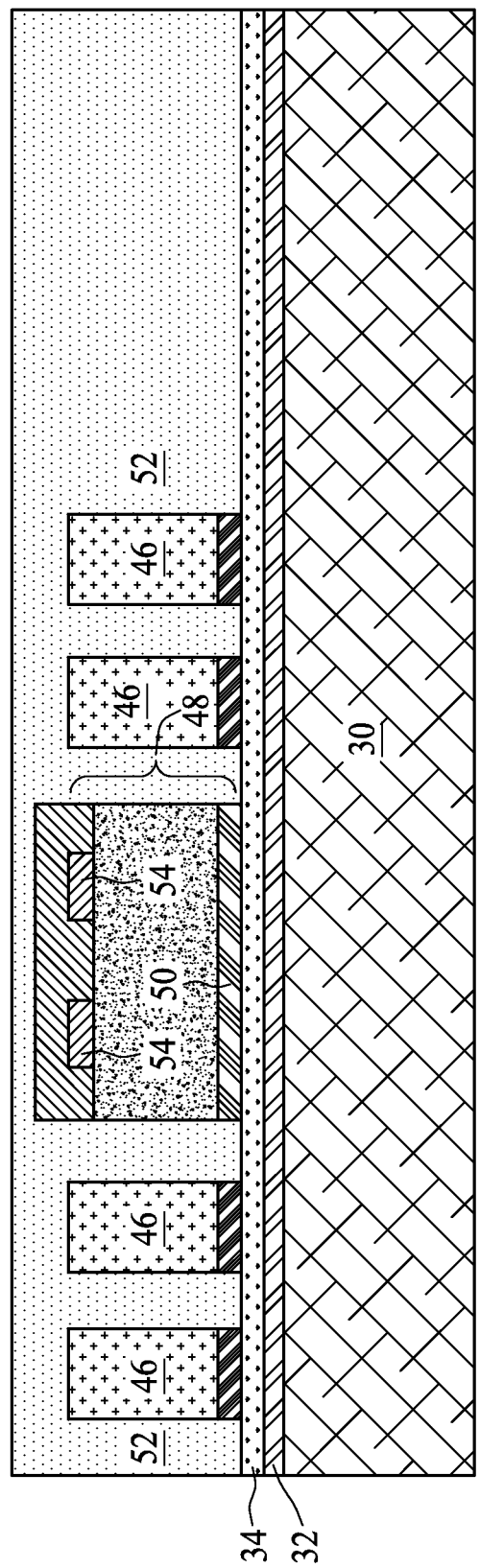

Referring to FIG. 9, encapsulating material 52 is encapsulated on device dies 48 and through-vias 46. The respective step is shown as step 216 in the process flow shown in FIG. 23. Encapsulating material 52 fills the gaps between neighboring device dies 48, and encircles each of device dies 48. Encapsulating material 52 may include a molding compound, a molding underfill, an epoxy, or a resin. After the encapsulating process, the top surface of encapsulating material 52 is higher than the top ends of metal pillars 54 and through-vias 46.

Figure 10:
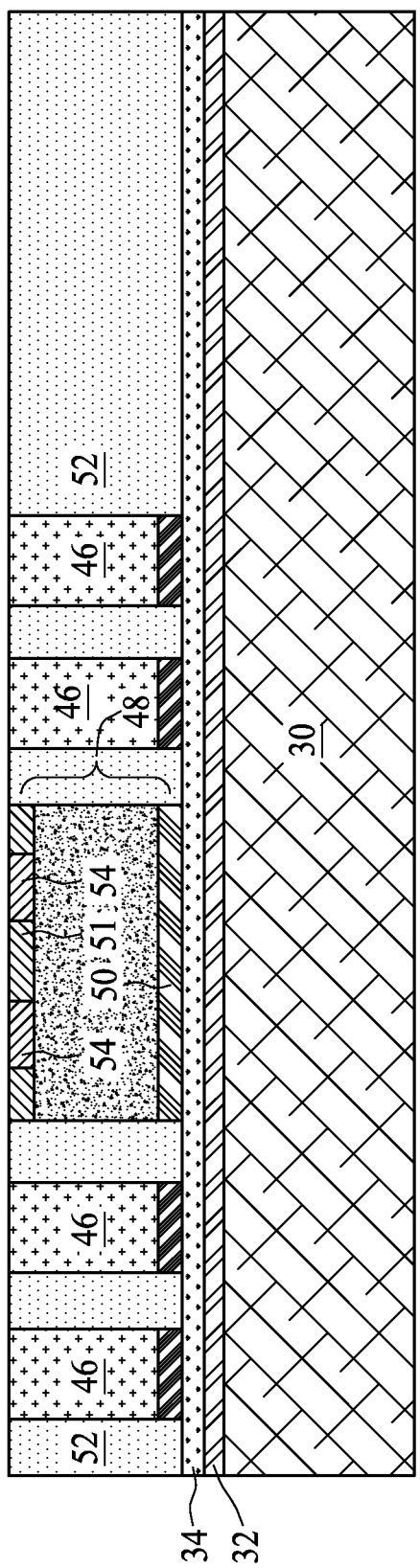

Next, a planarization step such as a Chemical Mechanical Polish (CMP) step or a grinding step is performed to planarize encapsulating material 52, until through-vias 46 are exposed. The respective step is also shown as step 216 in the process flow shown in FIG. 23. The resulting structure is shown in FIG. 10. Metal pillars 54 of device dies 48 are also exposed as a result of the planarization. Due to the planarization, the top surfaces of through-vias 46 are substantially level (coplanar) with the top surfaces of metal pillars 54, and are substantially level (coplanar) with the top surface of encapsulating material 52.

Figure 11:
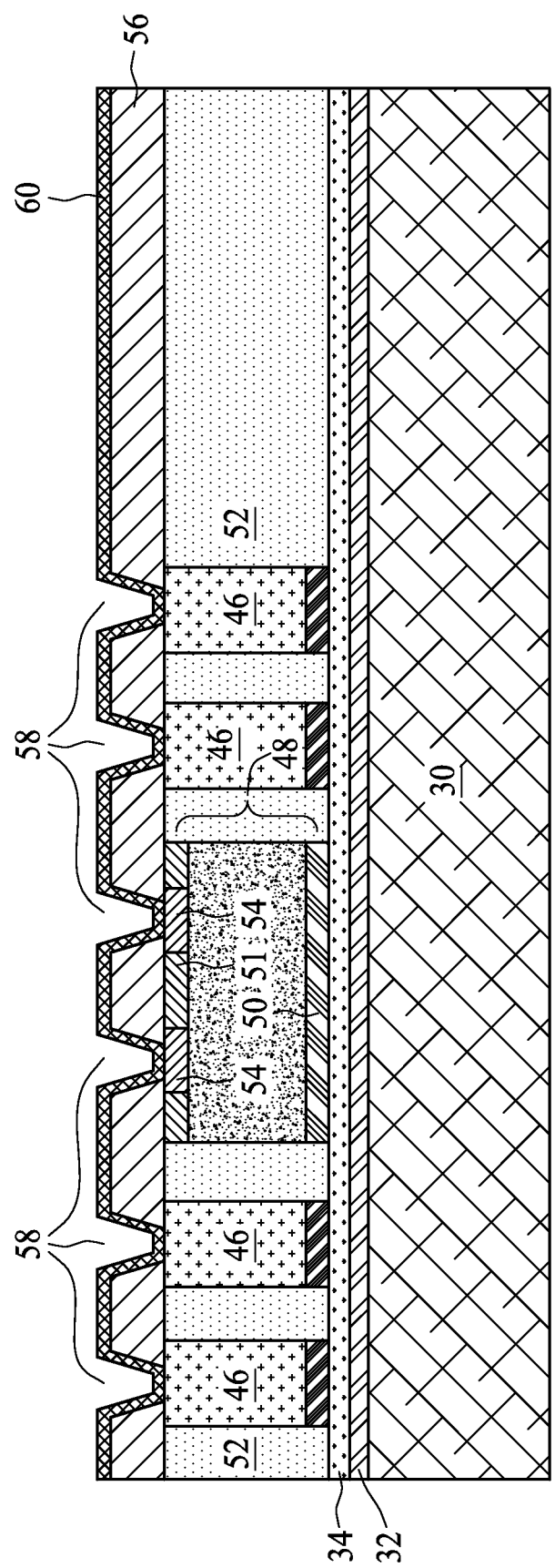

FIGS. 11 through 18 illustrate the formation of front-side RDLs and the respective dielectric layers. Referring to FIG. 11, dielectric layer 56 is formed. The respective step is shown as step 218 in the process flow shown in FIG. 23. In accordance with some embodiments of the present disclosure, dielectric layer 56 is formed of an organic material, which may be a polymer such as PBO, polyimide, benzocyclobutene (BCB), or the like. In accordance with some embodiments, dielectric layer 56 is formed of an inorganic material such as silicon nitride, silicon oxide, or the like. Dielectric layer 56 may be coated as a fluid, and then cured. In accordance with some embodiments, dielectric layer 56 is formed of a pre-formed film, and is laminated. Openings 58 are formed in dielectric layer 56 to expose through-vias 46 and metal pillars 54. The formation of openings 58 may be performed through a photo lithography process.

As also shown in FIG. 11, seed layer 60 is formed, which includes portions extend into openings 58 (FIG. 11) and portions over dielectric layer 56. Seed layer 60 may include a titanium layer and a copper layer over the titanium layer. Alternatively, seed layer 60 includes a copper layer with no titanium layer. Seed layer 60 may be formed, for example, using Physical Vapor Deposition (PVD).

Figure 12:
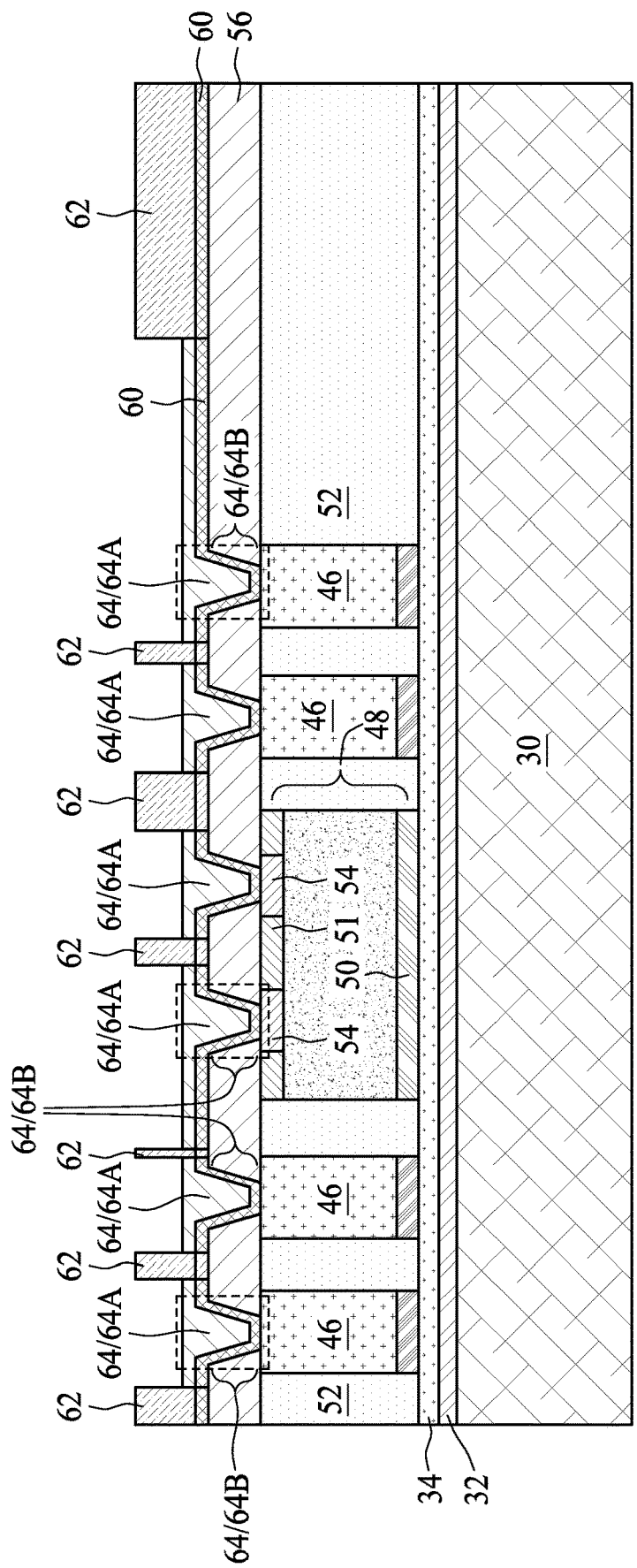
Figure 13:
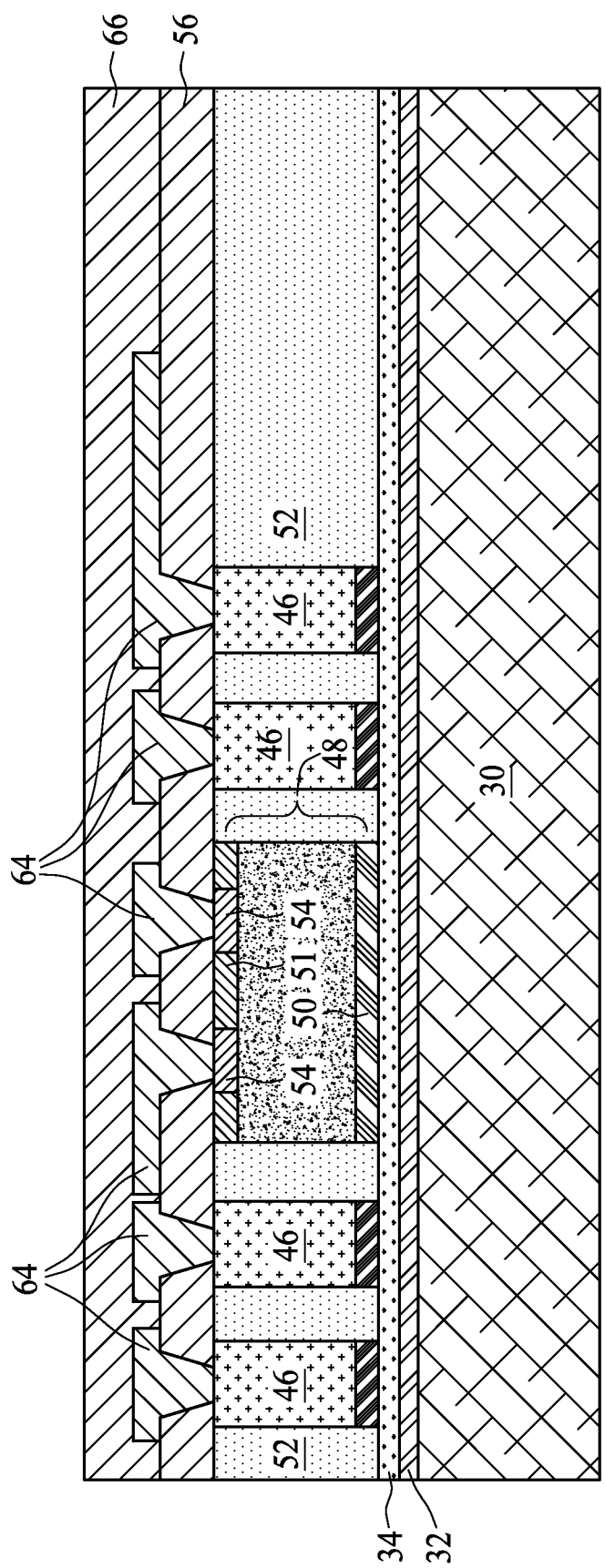
Figure 14:
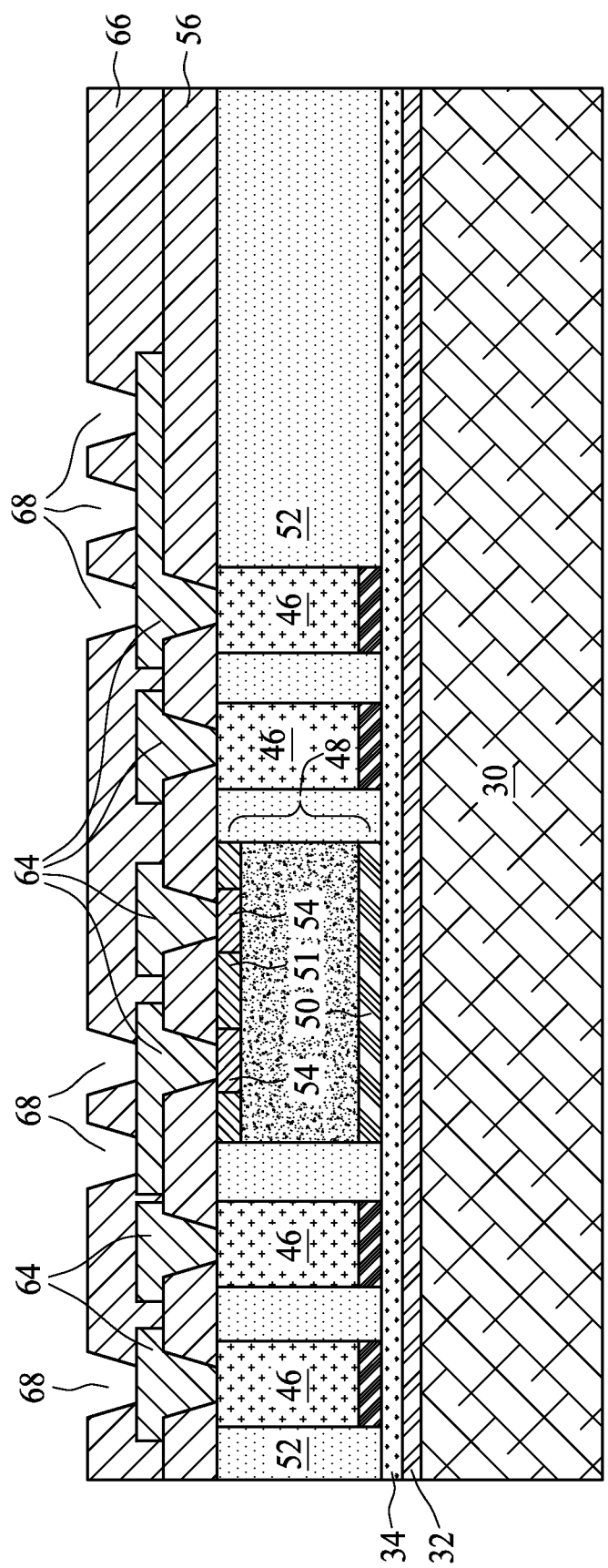

Next, referring to FIG. 12, patterned mask 62 is formed over seed layer 60. In accordance with some embodiments, patterned mask 62 is formed of a photo resist, which is patterned to expose some portions of seed layer 60. Next, a plating step is performed to form Redistribution Lines (RDLs) 64 in the openings in patterned mask 62, wherein a metallic material such as copper is plated on the exposed portions of seed layer 60. The respective step is shown as step 220 in the process flow shown in FIG. 23. RDLs 64 are connected to metal pillars 54 and through-vias 46. RDLs 64 include metal traces (including metal lines and/or metal pads) 64A over dielectric layer 56. RDLs 64 further includes vias 64B in opening 58 (FIG. 11). The portions of seed layer 60 overlapped by the plated material are also considered as parts of RDLs 64. After the plating, patterned mask 62 is removed, revealing the underlying portions of seed layer 60. The revealed portions of seed layer 60 are then etched, leaving RDLs 64 as shown in FIG. 13.

Figure 22A:
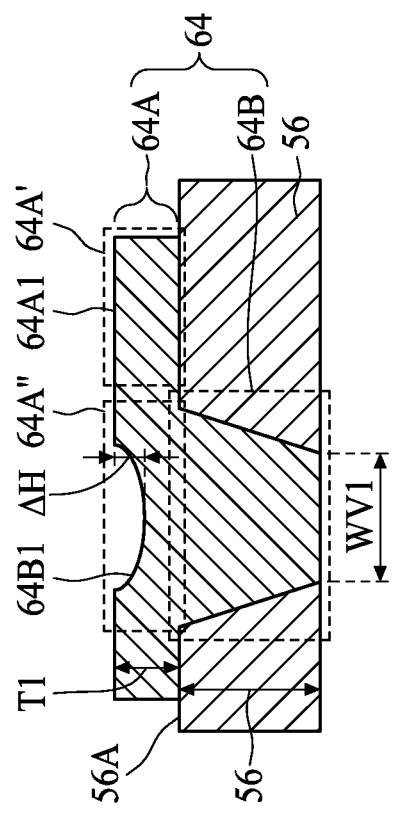
FIGS. 22A, 22B, 22C, and 22D illustrate several profiles of redistribution lines in accordance with some embodiments.

In accordance with some embodiments of the present disclosure, the plating process is controlled, and the sizes of vias 64B are selected, so that the top surfaces of RDLs 64 are planar or substantially planar. FIGS. 22A, 22B, 22C, and 22D illustrate some exemplary cross-sectional shapes of vias 64B and the corresponding connecting metal traces 64A. In these examples, metal traces 64A include metal trace portions 64A' misaligned with (not directly over) vias 64B. Top surface 64A1 of metal trace portions 64A' are planar, while vias 64B and the overlying metal trace portions (64A") may have different profiles. FIG. 22A illustrates a conformal RDL 64. Different portions of RDL 64 (including via 64B and metal trace 64A) have a same (or substantially the same) thickness T1. Accordingly, the lowest point of the top surface 64B1 of via 64B is lower than top surface 64A1 by height difference ΔH, which is equal to thickness T2 of dielectric layer 56.

Figure 22B:
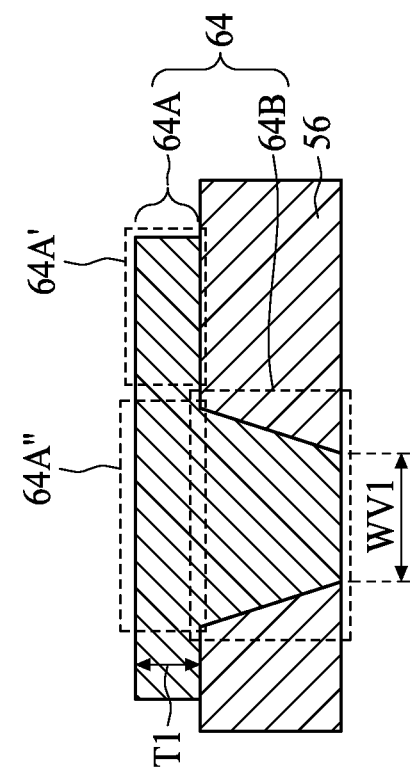

FIG. 22B illustrates a profile of RDL 64, which includes metal trace 64A having a recess, and via 64B underlying metal trace 64A. Metal trace 64A includes portion 64A" directly over via 64B, and portion 64A' higher than, but misaligned from, via 64B. The center of the lowest point of top surface 64B1 of metal trace portion 64A" is recessed from the top surface 64A1 of metal trace portion 64A'. Height difference ΔH is smaller than thickness T2 of dielectric layer 56, and may be smaller than thickness T1. The lowest point of top surface 64B1 may also be higher than top surface 56A of dielectric layer 56 in these embodiments.

Figure 22C:
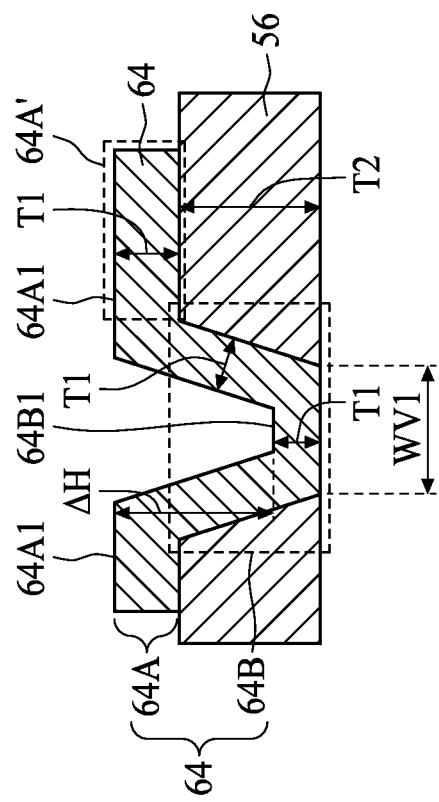

FIG. 22C illustrates a profile of RDL 64, which includes metal trace 64A having a hump, and via 64B directly underlying the hump. The center of the top surface 64B1 of metal trace portion 64A" is higher from the top surface 64A1 of metal trace portion 64A'. Height difference ΔH between the highest point of the hump and top surface 64A1 is greater than about 0.5 μm, and may be greater than about 1 μm.

Figure 22D:
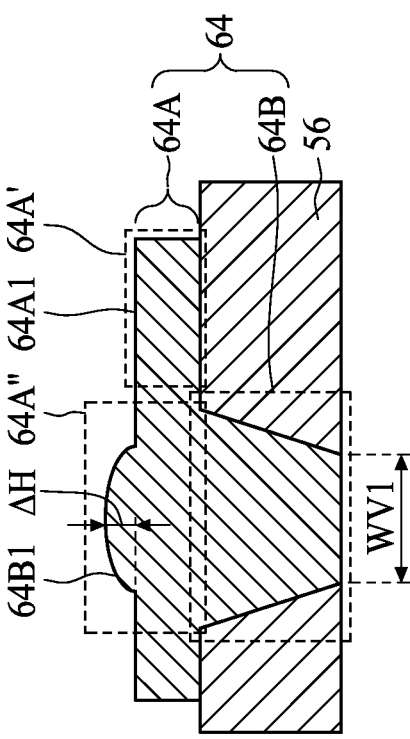

FIG. 22D illustrates a profile of RDL 64 with the top surface metal trace portions 64A' and 64A" being coplanar or substantially coplanar with each other. In accordance with these embodiments of the present disclosure, with RDL 64 having the substantially coplanar top surface, height difference ΔH (if any) between the highest point (if there is a hump) or lowest point (if there is a recess) of the top surface of metal trace portion 64A" and top surface 64A1 of metal trace portion 64A' is smaller than about 1 μm, and may be smaller than about 0.5 μm. It is noted that whether the top surface of RDL 64 is considered as (substantially) planar or not is related to the thickness T1 of metal trace portion 64A', and the smaller thickness T1 is, the smaller height difference ΔH needs to be if it is to be considered as planar or substantially planar. Throughout the description, the term "substantially planar" means that height difference ΔH is smaller than 20 percent of thickness T1 or smaller. The term "substantially planar" may also mean that height difference ΔH is smaller than 10 percent or 5 percent of thickness T1 or smaller, depending on the routing requirement. For example, when thickness T1 is about 2 μm, ΔH needs to be smaller than 0.4 μm or lower, and when thickness T1 is about 4 μm, ΔH needs to be smaller than about 0.8 μm. In accordance with some embodiments of the present disclosure, the planar top surfaces of RDLs are the result of the plating, and no planarization such as Chemical Mechanical Polish (CMP) or grinding is used to achieve the planar top surfaces.

In accordance with some embodiments of the present disclosure, various factors may be adjusted in combination to achieve the profile as shown in FIG. 22D, in which RDL 64 has a planar or substantially planar top surface. For example, via size Wv1 (which is either length or width) may be reduced to achieve planar RDL top surfaces. It is realized that if via size Wv1 is too big, the profile as shown in FIG. 22A may be formed. With via size Wv1 being reduced, the profile as shown in FIG. 22B may be achieved. However, if via size is too small, humps (FIG. 2C), seams, or air gaps may be undesirably formed in via 64B. Accordingly, via size needs to be in a certain range. In accordance with some exemplary embodiments, to achieve the planar top surface as shown in FIG. 22D, via size Wv1 may be smaller than about 10 μm. Via size Wv1 may also be smaller than about 7 μm and greater than about 4 μm.

Other factors affecting the profile of the top surface of RDL 64 including the plating rate (the increase in thickness per unit time) for plating RDL 64 (FIG. 12). A low plating rate may result in a conformal RDL 64 as shown in FIG. 22A. When the plating rate is increased, the profile in FIG. 22B may be achieved. Further increasing the plating rate may result in the planar top surface as shown in FIG. 22D. In some embodiments, further increasing the plating rate can cause the hump as shown in FIG. 22C. In accordance with some exemplary embodiments, the plating rate is in the range between about 0.1 μm/minute and about 1.0 μm/minute. The plating rate may be measured (and controlled) through adjusting the electrical current for the plating, wherein the electrical current is conducted through the respective plating solution. In some exemplary embodiments, the electrical current is higher than about 2.0 amps per square decimeter (ASD) in order to form an RDL with a planar top surface. In addition to these factors, other factors such as the thickness of RDLs 64 also affect the profile of RDLs 64. It is realized the various factors in combination affect the top surface profile of RDL 64, and the optimum via size and plating rate may be found for a selected RDL through experiments.

Referring to FIG. 13, in accordance with some embodiments, dielectric layer 66 is formed over RDLs 64. The respective step is shown as step 222 in the process flow shown in FIG. 23. Dielectric layer 66 may be formed of a material selected from the same candidate materials for forming dielectric layer 56, and may be formed by coating or laminating. Openings 68 are then formed in dielectric layer 66 to reveal RDLs 64, as shown in Figured 14.

Figure 15:
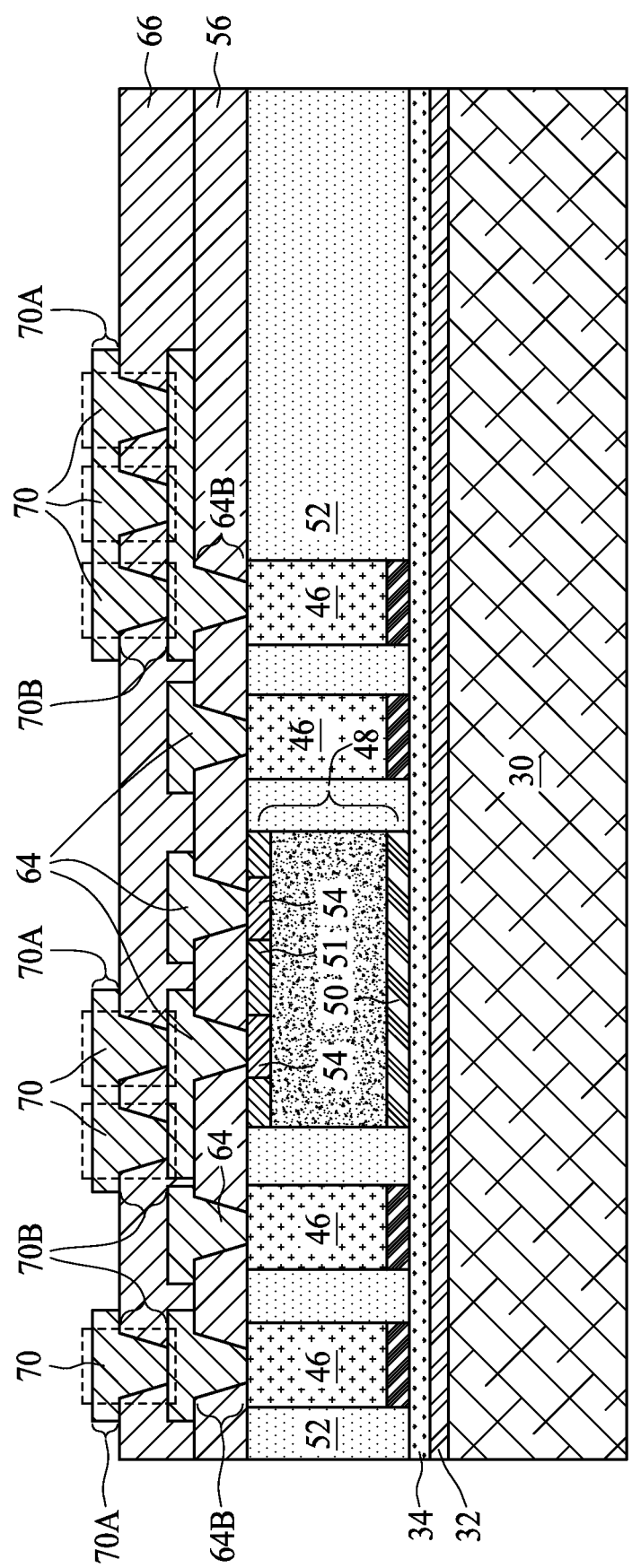

Next, a plating step is performed, which may be performed similar to the formation of RDLs 64 in FIG. 12. As a result, RDLs 70 are formed, as shown in FIG. 15. The respective step is shown as step 224 in the process flow shown in FIG. 23. RDLs 70 include metal traces 70A and vias 70B. Similarly, it is also possible that RDLs 70 have different top surface profiles when different via sizes and/or different plating rates are adopted. In accordance with some embodiments of the present disclosure, the forming factors such as the sizes of vias 70B and the plating rates are selected so that the top surfaces of RDLs 70 are substantially coplanar, as discussed referring to FIGS. 22B through 22D.

FIG. 15 illustrates stacking vias, in which some of vias 70B are vertically aligned to (directly over) the respective underlying vias 64B. When the underlying RDLs have planar top surfaces, top surfaces of the overlying RDLs 70 are not recessed or protruded even if they are directly over the underlying vias. If the underlying RDLs 64 have the profiles as shown in FIG. 22A, 22B, or 22C, the profile of the overlying RDLs 70 may be affected, with the top surfaces of the portions of RDLs 70 directly over vias 64B either recessed or protruding. The recessing effect or the protruding effect may be increasingly more severe when more vias are stacked directly over the already stacked vias, and eventually, the topography caused by the recessing or protruding may cause the upper (or top) RDLs to crack. In the embodiments of the present disclosure, by making the top surfaces of RDLs 64 and 70 to be planar, such problems can be eliminated.

Figure 16:
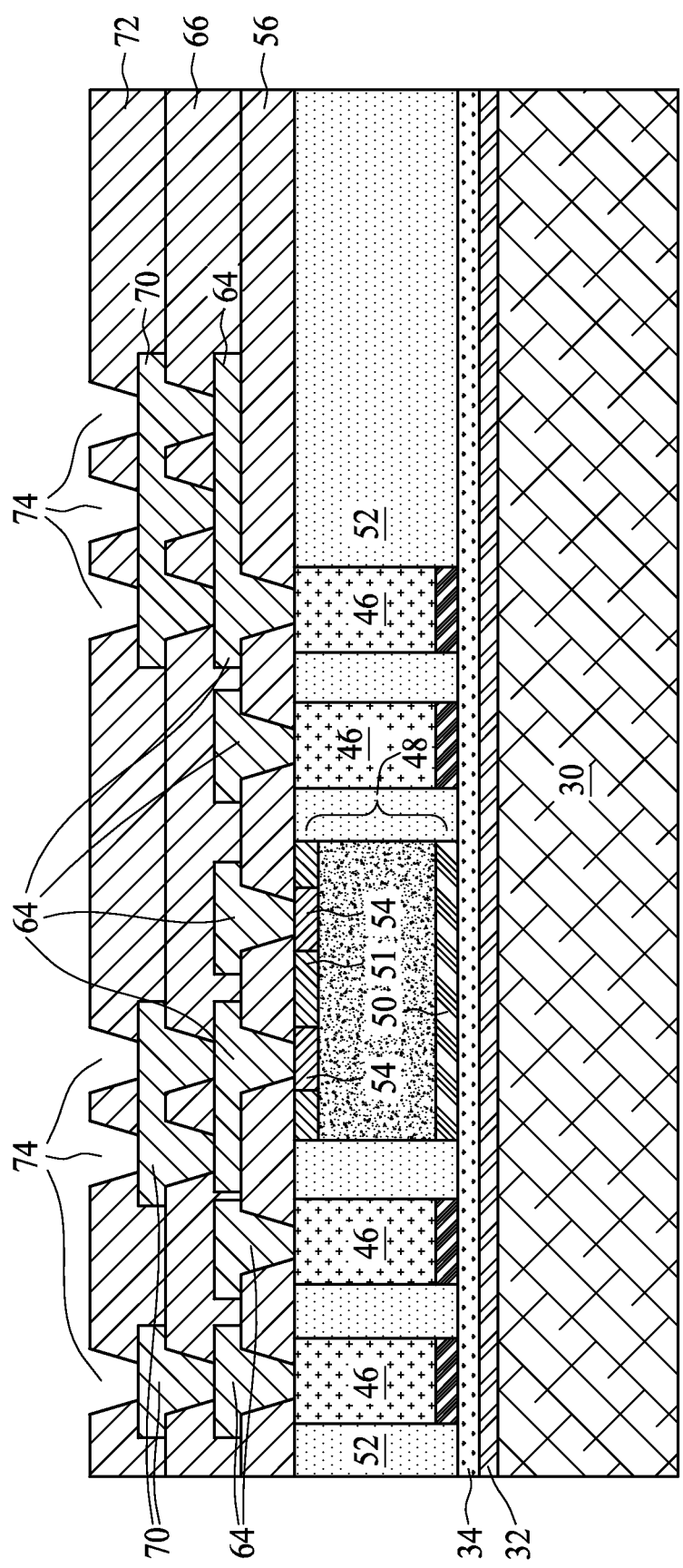

Referring to FIG. 16, in accordance with various embodiments, dielectric layer 72 is formed over RDLs 70. The respective step is shown as step 226 in the process flow shown in FIG. 23. Dielectric layer 72 may be formed of a material selected from the same candidate materials for forming dielectric layer 56, and may be formed by coating or laminating. Openings 74 are then formed in dielectric layer 72, as shown in Figured 16.

Figure 17:
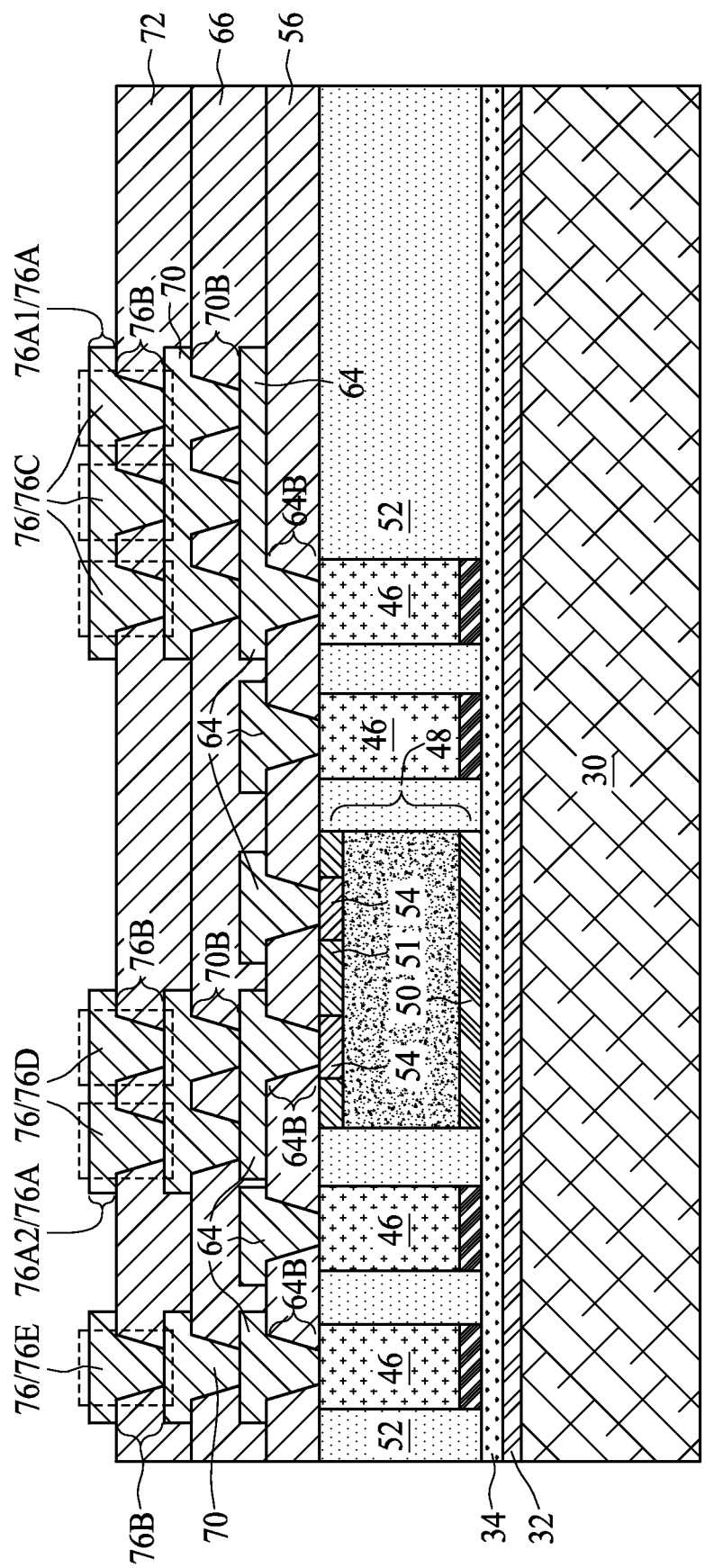

Next, a plating step is performed, which may be performed similar to the formation of RDLs 64 in FIG. 12. As a result, RDLs 76 (including 76C, 76D, and 76E) are formed, as shown in FIG. 17. The respective step is shown as step 228 in the process flow shown in FIG. 23. RDLs 76 include metal traces 76A and vias 76B. In accordance with some embodiments of the present disclosure, the sizes of vias 76B and the plating rates are selected so that the top surfaces of RDLs 76 are substantially coplanar, as discussed referring to FIGS. 22B through 22D.

FIG. 17 further illustrates more vias 76B stacked directly over the already stacked vias 70B and 64B. Furthermore, some of vias 76B are connected to the same metal trace 76A. For example, as shown in FIG. 17, three illustrated vias 76B are connected to the same metal trace 76A1, and two illustrated vias 76B are connected to the same metal trace 76A2. In accordance with some embodiments, vias 76B may form an array (for example, a 2×2 array, a 2×3 array, or a 3×3 array). Each of vias 76B may be aligned to one of vias 70B with a one-to-one correspondence. It is appreciated that in a chip, different via sizes may be needed. For example, the vias for conducting power such as VDD may need to be larger than signal vias due to higher currents. However, increasing the sizes of vias may result in the respective RDLs on the same chip to have different profiles (FIGS. 22A through 22D), and hence making the stacking vias prone to problems caused by via recessing or protruding, as aforementioned. In the embodiments of the present disclosure, whenever larger vias are needed, the larger vias are separated into smaller vias, so that the sizes of all vias in the same dielectric layer (throughout the same package) are substantially uniform. For example, throughout the illustrated package, the vias at a same level have sizes ranging between about 80 percent and about 120 percent of an intended via size.

Figure 18:
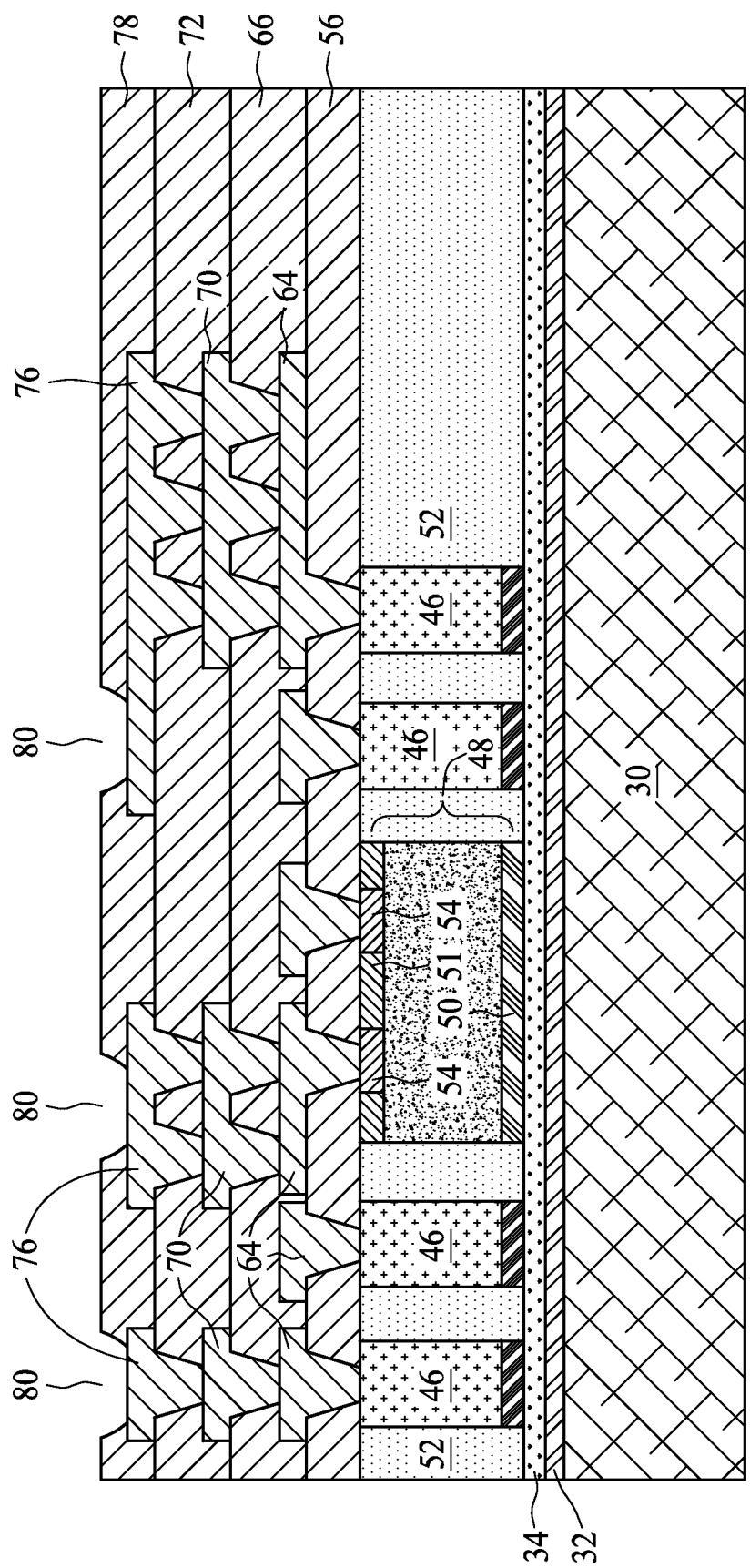

Referring to FIG. 18, dielectric layer 78 is formed over RDLs 76. Dielectric layer 78 may also be formed of a material selected from the same candidate materials for forming dielectric layer 56, and may be formed by coating or laminating. Openings 80 are then formed in dielectric layer 78.

Figure 19:
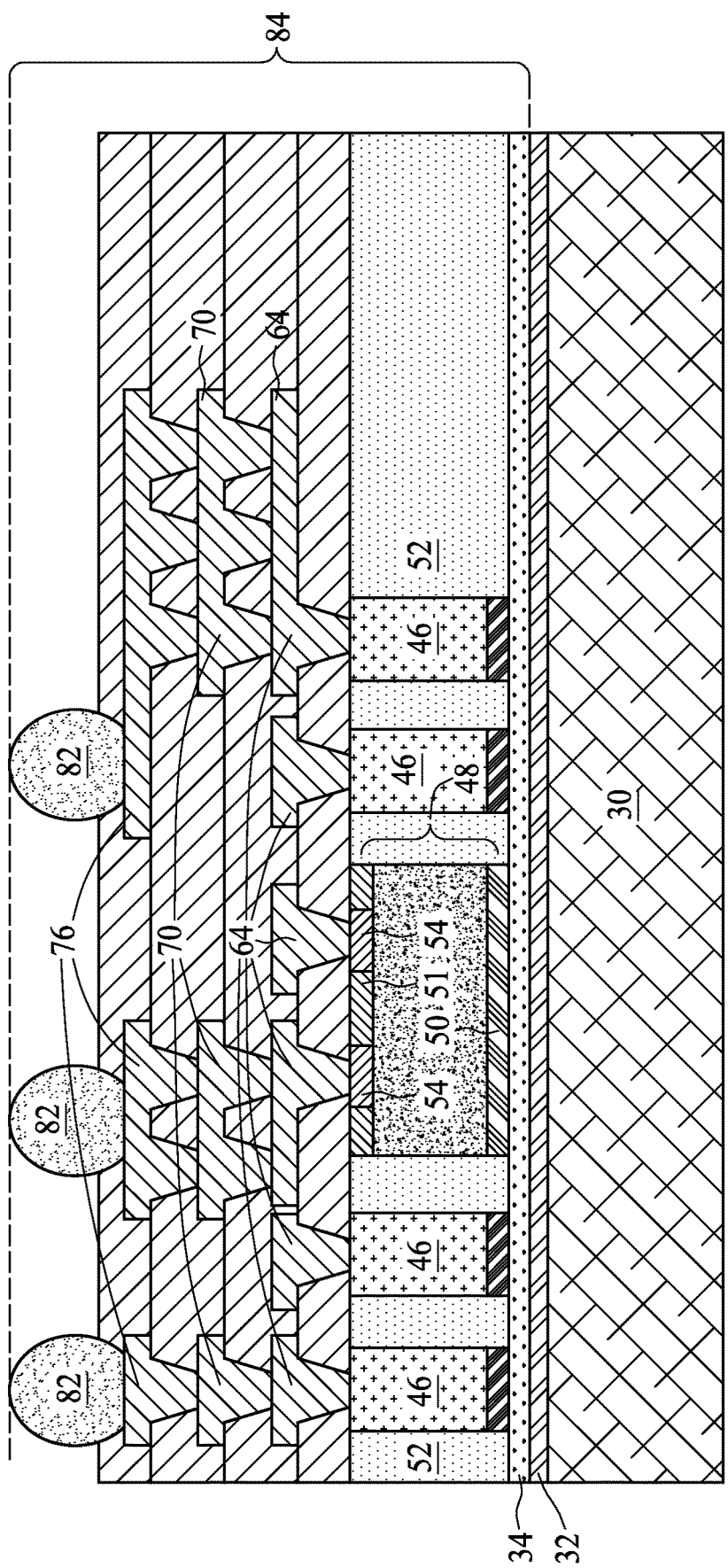

FIG. 19 illustrates the formation of electrical connectors 82 in accordance with some exemplary embodiments of the present disclosure. The respective step is shown as step 230 in the process flow shown in FIG. 23. Electrical connectors 82 are electrically coupled to RDLs 64/70/76, metal pillars 54, and/or through-vias 46. The formation of electrical connectors 82 may include placing solder balls over RDLs 76 and then reflowing the solder balls. In accordance with alternative embodiments of the present disclosure, the formation of electrical connectors 82 includes performing a plating step to form solder regions over RDLs 76 and then reflowing the solder regions. In accordance with some embodiments, a solder printing process is used for forming electrical connectors 82. Electrical connectors 82 may also include metal pillars, or metal pillars and solder caps, which may also be formed through plating. Throughout the description, the combined structure including device dies 48, through-vias 46, encapsulating material 52, RDLs 64/70/76, and dielectric layers 56/66/72 will be referred to as wafer-level package 84, which is a composite wafer including a plurality of device dies 48.

FIG. 19 illustrates three RDL layers. In accordance with some embodiments, there may be a single layer, two layers, or more than three layers of RDLs, depending on the routing requirement of the respective package.

Next, package 84 is de-bonded from carrier 30 (FIG. 19). In accordance with an exemplary de-bonding process, dicing tape 86 (FIG. 20) is attached to package 84 to protect electrical connectors 82, wherein dicing tape 86 is fixed to a dicing frame (not shown). The de-bonding is performed, for example, by projecting a UV light or a laser on adhesive layer 32 (FIG. 19). For example, when adhesive layer 32 is formed of LTHC, the heat generated from the light or laser causes the LTHC to be decomposed, and hence carrier 30 is detached from wafer-level package 84. The resulting structure is shown in FIG. 20.

Figure 20:
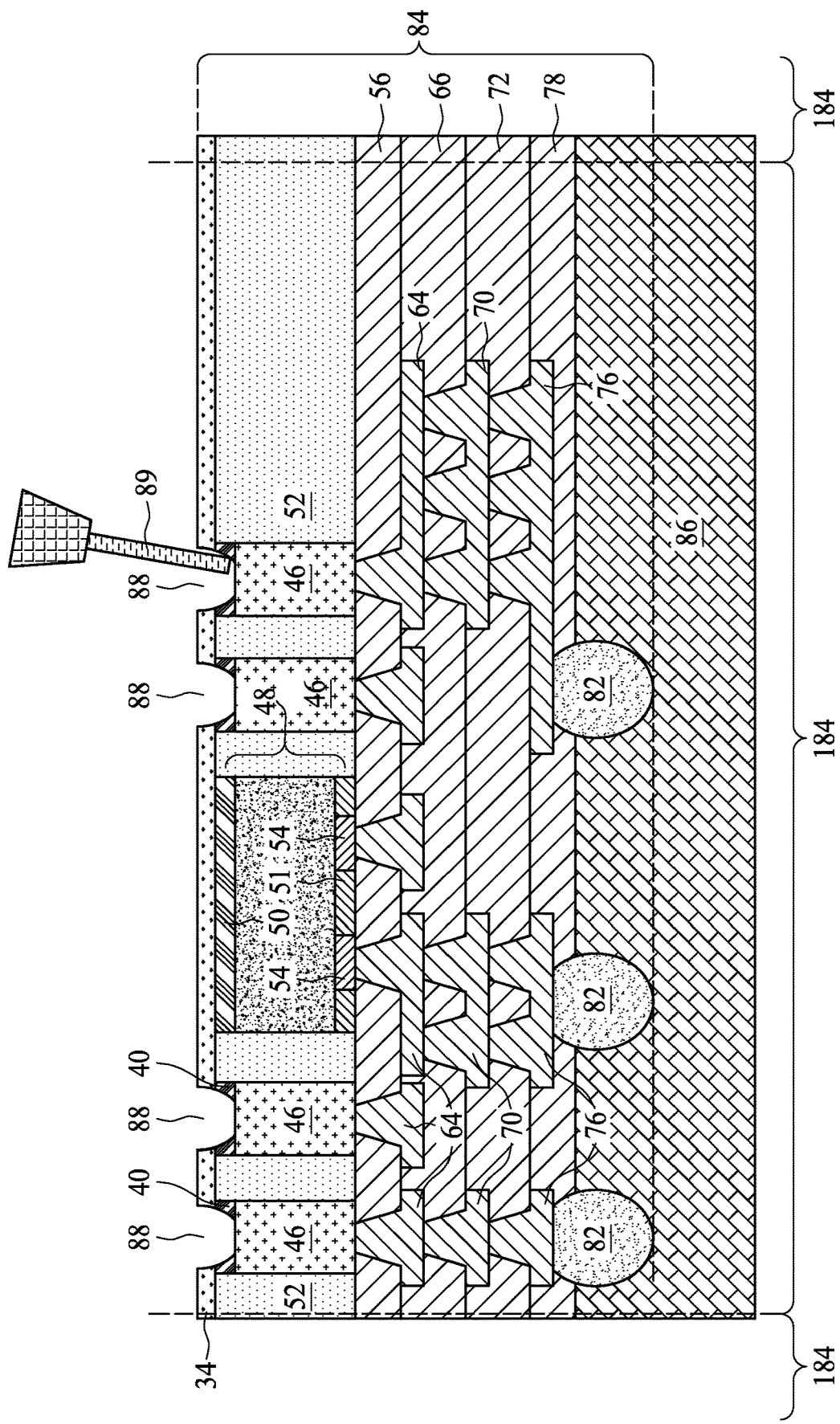

FIG. 20 also illustrates the patterning for forming openings 88 in dielectric layer 34. The respective step is shown as step 232 in the process flow shown in FIG. 23. For example, when dielectric layer 34 is a polymer layer, it can be patterned using laser drill (through laser beam 89) to remove the portions overlapping through-vias 46, so that through-vias 46 are exposed through openings 88.

In the embodiments in which a portion of conductive seed layer 40 is formed of titanium, the titanium layer of conductive seed layer 40 may also be removed. For example, Hydrogen Fluoride (HF) gas or a diluted HF solution may be used to etch titanium. The copper in conductive seed layer 40 is exposed, and hence the subsequently formed backside RDLs or electrical connectors such as solder regions may be formed thereon.

In subsequent steps, as shown in FIG. 20, package 84 is sawed apart into a plurality of packages 184, each including (at least) one of device dies 48 and the corresponding through-vias 46. The respective step is shown as step 234 in the process flow shown in FIG. 23.

Figure 21:
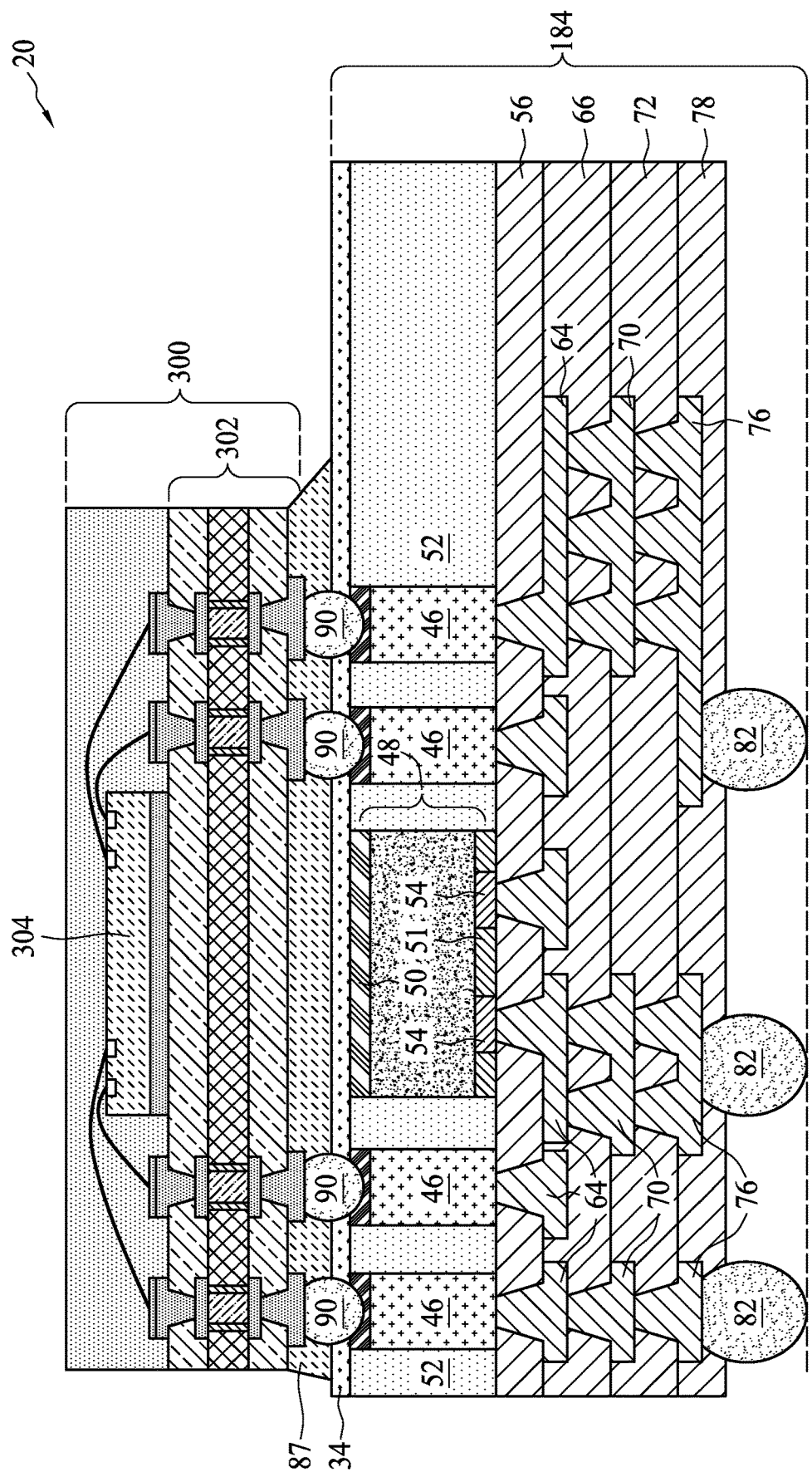

FIG. 21 illustrates the bonding of package 300 to package 184, thus forming PoP package 20. The respective step is shown as step 236 in the process flow shown in FIG. 23. Packages 300 and 184 are also referred to as a top package and a bottom package, respectively, of the PoP package 20. In the exemplary embodiments as shown in FIG. 21, no backside RDL is illustrated in package 184, while the backside RDLs may be formed in accordance with alternative embodiments. The bonding is performed through solder regions 90, which join through-vias 46 to the metal pads in the overlying package 300. In accordance with some embodiments of the present disclosure, package 300 includes device die(s) 304, which may be memory dies such as Static Random Access Memory (SRAM) dies, Dynamic Random Access Memory (DRAM) dies, or the like. The memory dies may also be bonded to package substrate 302 in some exemplary embodiments. After the bonding of top package 300 to bottom package 184, underfill 87 is disposed into the gap between top package 300 and bottom package 184, and is then cured.

Some embodiments of the present disclosure have some advantageous features. By forming RDLs with their vias and RDLs having top surfaces substantially coplanar with each other, more vias may be stacked directly over the underlying vias without the concern of the problems caused by high topography. This has two advantageous features. Firstly, if the embodiments of the present disclosure are not used, the overlying vias may have to be misaligned from the underlying vias to prevent the topography to become increasingly severe with the increase of the number of RDL layers. In some embodiments of the present disclosure, vias may be stacked, and the chip area is saved. RDLs may be placed closer to each other. Secondly, by stacking vias, the signal paths can be shortened, and hence the side effects such as the parasitic capacitance caused by lengthened signal paths can be reduced. This is especially beneficial for high-frequency signals.

In accordance with some embodiments of the present disclosure, a method includes forming a dielectric layer over a conductive feature, forming an opening in the dielectric layer, and plating a metallic material to form a redistribution line electrically coupled to the conductive feature. The redistribution line includes a via in the opening, and a metal trace. The metal trace includes a first portion directly over the via, and a second portion misaligned with the via. A first top surface of the first portion is substantially coplanar with a second top surface of the second portion of the metal trace.

In accordance with alternative embodiments of the present disclosure, a method includes forming a first dielectric layer over a conductive feature, forming a first opening in the first dielectric layer, with a portion of the conductive feature exposed through the first opening, and plating a first redistribution line including a first via and s first metal trace. The first via is in the first opening. The first metal trace includes a first portion directly over the first via, and a second portion misaligned with the first via. The method further includes forming a second dielectric layer over the first metal trace, forming a second opening in the second dielectric layer, with a first top surface of the first portion of the first metal trace exposed through the second opening, and plating a second redistribution line. The second redistribution line includes a second via and a second metal trace. The second via is in the second opening, and includes a bottom surface in contact with the first top surface of the first redistribution line. The second metal trace includes a third portion directly over the second via, and a fourth portion misaligned with the second via.

In accordance with alternative embodiments of the present disclosure, a method includes encapsulating a device die in an encapsulating material, performing a planarization to exposed a metal pillar of the device die, forming a first polymer layer overlapping both the device die and the encapsulating material, forming a first opening in the first polymer layer to expose the metal pillar, and forming a first redistribution line including a first via and a first metal trace. The first via is in the first opening. The first metal trace is over the first polymer layer. The method further includes forming a second polymer layer over the first redistribution line, forming a first opening array in the second polymer layer to expose the first redistribution line, plating a second redistribution line including a first via array and a second metal trace. The first via array is in the first opening array. The second metal trace is over and contacting the first via array. The method further includes forming a third polymer layer over the second redistribution line, forming a second opening array in the third polymer layer to expose the second redistribution line, and plating a third redistribution line includes a second via array and a third metal trace. The second via array is in the second opening array, wherein each of vias in the second via array overlaps one of vias in the first via array with a one-to-one correspondence. The third metal trace over and contacting the second via array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    molding a conductive post and a device die in a molding compound, wherein a first top surface of the conductive post and a second top surface of the device die are coplanar;
    forming a conductive line comprising a via and a conductive trace over the via;
    forming a first dielectric layer over the conductive line;
    forming a first opening in the first dielectric layer; and
    plating a metallic material to form a first redistribution line electrically coupled to the conductive line, wherein the first redistribution line comprises:
        a first array of vias comprising a first via, with the first via being in the first opening; and
        a first metal trace comprising a first portion directly over and contacting the first array of vias, and a second portion misaligned with the first via, wherein a third top surface of the first portion is higher than or lower than a fourth top surface of the second portion of the first metal trace by a height difference, and the height difference is smaller than about 20 percent of a thickness of the second portion of the first metal trace;

forming a second dielectric layer over the first metal trace;

forming a second opening in the second dielectric layer, with the first portion of the first metal trace exposed through the second opening; and plating an additional metallic material to form a second redistribution line, wherein the second redistribution line comprises:
  a second array of vias comprising a second via, with the second via being in the second opening, wherein the second via comprises a bottom surface in contact with the third top surface, and wherein each of vias in the second array of vias overlaps one of vias in the first array of vias with a one-to-one correspondence, and wherein the via in the conductive line, the first via in the first array of vias, and the second via in the second array of vias are vertically aligned to the conductive post; and
  a second metal trace comprising a third portion directly over and contacting the second array of vias, and a fourth portion misaligned with the second via.

2. The method of claim 1, wherein the third top surface is higher than the fourth top surface.

3. The method of claim 1, wherein the third top surface is lower than the fourth top surface.

4. The method of claim 1, wherein no planarization is performed on the first metal trace.

5. The method of claim 1, wherein the first metal trace is in physical contact with top surfaces of all vias in the first array of vias and bottom surfaces of all vias in the second array of vias.

6. The method of claim 1, wherein the forming the first dielectric layer comprises laminating a polymer film.

7. The method of claim 1, wherein the first dielectric layer overlaps both of the device die and the molding compound.

8. The method of claim 1, wherein the first redistribution line is in a package comprising a plurality of vias in the first dielectric layer, and wherein all vias in the first dielectric layer have a same size.

9. A method comprising:
  molding a conductive post and a device die in a molding compound, wherein a first top surface of the conductive post and a second top surface of the device die are coplanar;
  forming a conductive line comprising a via and a conductive trace over the via;
  forming a first dielectric layer over the conductive line;
  forming a first opening in the first dielectric layer, with a portion of the conductive line exposed through the first opening;
  plating a first redistribution line comprising:
    a first array of vias comprising a first via, with the first via being in the first opening; and
    a first metal trace comprising a first portion directly over and physically contacting the first array of vias, and a second portion misaligned with the first array of vias, wherein the first portion has a third top surface, and the second portion has a fourth top surface, and the third top surface is higher than the fourth top surface;
  forming a second dielectric layer over the first metal trace;
  forming a second opening in the second dielectric layer, with the third top surface exposed through the second opening; and
  plating a second redistribution line comprising:
    a second array of vias comprising a second via, with the second via being in the second opening, wherein the second array of vias comprise bottom surfaces in contact with the third top surface of the first portion of the first metal trace, and wherein each of vias in the second array of vias overlaps one of vias in the first array of vias with a one-to-one correspondence, and wherein the via in the conductive line, the first via in the first array of vias, and the second via in the second array of vias are vertically aligned to the conductive post; and
    a second metal trace comprising a third portion directly over and physically contacting the second array of vias, and a fourth portion misaligned with the second array of vias.

10. The method of claim 9, wherein each via in the second array of vias is in physical contact with the first metal trace.

11. The method of claim 10, wherein a height difference between the third top surface and the fourth top surface is smaller than about to 1.0 µm.

12. The method of claim 9, wherein a portion of each via in the second array of vias overlaps at least a portion of to a corresponding via in the first array of vias.

13. The method of claim 9, wherein each of the first array of vias and the second array of vias is at least a 2×2 array.

14. A method comprising:
  encapsulating a device die and a metal post in an encapsulating material;
  performing a planarization to exposed a metal pillar of the device die, wherein a first top surface of the metal post is coplanar with a second top surface of the device die;
  forming a first polymer layer overlapping both the device die and the encapsulating material;
  forming a first opening in the first polymer layer to expose the metal pillar;
  forming a first redistribution line comprising a first via in the first opening, and a first metal trace over the first polymer layer;
  forming a second polymer layer over the first redistribution line;
  forming a first array of openings in the second polymer layer to expose the first redistribution line;
  plating a second redistribution line comprising:
    a first array of vias in the first array of openings; and
    a second metal trace over and contacting the first array of vias;
  forming a third polymer layer over the second redistribution line;
  forming a second array of openings in the third polymer layer to expose the second redistribution line; and
  plating a third redistribution line comprising:
    a second array of vias in the second array of openings, wherein each of vias in the second array of vias overlaps one of vias in the first array of vias with a one-to-one correspondence, wherein the first via, a second via in the first array of vias, and a third via in the second array of vias are vertically aligned to the metal post; and
    a third metal trace over and contacting the second array of vias.

15. The method of claim 14, wherein the plating the first redistribution line comprises:
  forming a seed layer over the first polymer layer;

forming a patterned mask over the seed layer;
plating the first redistribution line in an opening in the patterned mask and over the seed layer;
removing the patterned mask, wherein before the patterned mask is removed, the patterned mask covers portions of the seed layer; and
removing the portions of the seed layer.

16. The method of claim 14 further comprising stacking a third array of vias directly over the second array of vias.

17. The method of claim 14, wherein after the plating of the second redistribution line, an entirety of a top surface of the second redistribution line is planar.

18. The method of claim 14, wherein the second metal trace is in physical contact with top surfaces of all vias in the first array of vias and bottom surfaces of all vias in the second array of vias.

19. The method of claim 18 further comprising forming a solder region electrically coupled to all vias in the second array of vias, wherein the solder region is misaligned from the second array of vias.

20. The method of claim 9, wherein a height difference between a highest point of the third top surface and a lowest point of the fourth top surface is smaller than about 20 percent of a thickness of the second portion of the first metal trace.

* * * * *

UNITED STATES PATENT AND TRADEMARK OFFICE
CERTIFICATE OF CORRECTION

PATENT NO. : 11,018,025 B2  
APPLICATION NO. : 14/815169  
DATED : May 25, 2021  
INVENTOR(S) : Hsien-Wei Chen et al.

Page 1 of 1

It is certified that error appears in the above-identified patent and that said Letters Patent is hereby corrected as shown below:

In the Claims

In Claim 11, Column 12; Line 24 delete "to"  
In Claim 12, Column 12; Lines 26 delete "to"

Signed and Sealed this  
Thirty-first Day of August, 2021

Drew Hirshfeld  
*Performing the Functions and Duties of the*  
*Under Secretary of Commerce for Intellectual Property and*  
*Director of the United States Patent and Trademark Office*